United States Patent
Kimura et al.

(10) Patent No.: US 9,621,043 B2
(45) Date of Patent: Apr. 11, 2017

(54) VERSATILE CURRENT SENSOR FOR SWITCHING REGULATOR

(71) Applicant: Dialog Semiconductor (UK) Limited, London (GB)

(72) Inventors: Takashi Kimura, Tokyo (JP); Soichiro Ohyama, Kanagawa (JP); Susumu Tanimoto, Tokyo (JP)

(73) Assignee: Dialog Semiconductor (UK) Limited, London (GB)

( * ) Notice: Subject to any disclaimer, the term of this patent is extended or adjusted under 35 U.S.C. 154(b) by 79 days.

(21) Appl. No.: 14/840,489

(22) Filed: Aug. 31, 2015

(65) Prior Publication Data

US 2017/0063228 A1    Mar. 2, 2017

(51) Int. Cl.
*H02M 3/158* (2006.01)
*G01R 19/00* (2006.01)
*H02M 1/00* (2006.01)

(52) U.S. Cl.
CPC ........ *H02M 3/158* (2013.01); *G01R 19/0092* (2013.01); *H02M 2001/0009* (2013.01)

(58) Field of Classification Search
None
See application file for complete search history.

(56) References Cited

U.S. PATENT DOCUMENTS

| | | | |
|---|---|---|---|
| 6,160,388 A | 12/2000 | Skelton et al. | |
| 7,710,094 B1 | 5/2010 | Wong et al. | |
| 8,198,874 B2 | 6/2012 | Melanson | |
| 8,344,707 B2 | 1/2013 | Melanson et al. | |
| 2013/0021012 A1* | 1/2013 | Oddoart | H02M 3/156 323/282 |
| 2015/0137776 A1* | 5/2015 | Thomas | H02M 3/1588 323/271 |

(Continued)

FOREIGN PATENT DOCUMENTS

DE    4140069    11/1992

OTHER PUBLICATIONS

"On-Chip Digital Inductor Current Sensor for Monolithic Digitally Controlled DC-DC Converter," by Man Pun Chan et al., IEEE Transactions on Circuits and Systems,—I: Regular Papers, vol. 60, No. 5, May 2013, pp. 1232-1240.

(Continued)

*Primary Examiner* — Timothy J Dole
*Assistant Examiner* — Monica Mata
(74) *Attorney, Agent, or Firm* — Saile Ackerman LLC; Stephen B. Ackerman

(57) ABSTRACT

A preferred implementation of a switching converter with a versatile current sensor is achieved, by adding an integrator for instant sense current in the switching converter. The integrator calculates the average current of the switching converter and includes both positive and negative current sensing. The current sensor's response time is determined by the integrator coefficient and therefore not limited by the bandwidth of the current sensor. Performance degradation in the current sensor due to offset current is removed and the current sensor does not require a voltage reference or a current reference. High accuracy current monitoring and current sensing is achieved without an external sense device. The integrator of the current sensor serves to boost the gain of the switching converter.

20 Claims, 12 Drawing Sheets

(56) References Cited

U.S. PATENT DOCUMENTS

2015/0355242 A1 12/2015 Ozawa

OTHER PUBLICATIONS

"Nonlinear Average Current Control Using Partial Current Measurement," by Min Chen et al., 2007 IEEE, I-4244-0714-1/07, Feb. 2007, pp. 482-488.
German Search Report, File No. 10 2015 219 097.8, Applicant: Dialog Semiconductor (UK) Limited, Mail Date: Apr. 7, 2016, 7 pgs, and English Language Translation, 7 pgs.

* cited by examiner

VERSATILE CURRENT SENSOR FOR SWITCHING REGULATOR

BACKGROUND OF THE INVENTION

Field of the Invention

This invention relates generally to Buck converters, Boost converters, and other types of switching converters, and the use of a current sensor to sense and control the current in the switching converter.

Description of Related Art

A current sensor may be used in a switching converter to measure input or output current and to generate a signal proportional to it. The generated signal may be an analog or digital current and utilized as a current source or for current limiting.

FIG. 1 shows a typical circuit topology 100 of low side current sensor 105 and corresponding output stage 110 of a switching converter. Low side current sensor 105 is comprised of a standard op-amp with negative feedback, constant bias current IREF and NMOS device 130, configured to non-inverting input (V+), and NMOS sense device 140, configured to inverting input (V−). The supply voltage for bias current IREF limits the op-amp's output voltage, which in turn limits sense current ISENSE. Output stage 110 is comprised of PMOS high side device M1 and NMOS low side device M2, driven by PMOS and NMOS drivers respectively. The drains of devices M1 and M2 are connected at voltage VLX, and to inductor L, which drives the load current IL into capacitance C and resistance R.

The amount of sense current will parallel that of the load current and an averaged sense current may be required. Filtering may be used to obtain the sense current, limiting the frequency bandwidth of the current sensor. Since VLX and IL of FIG. 1 contain a wide range of frequency components, op-amp 120 needs a wide bandwidth to follow VLX and IL, and any filtering will degrade the sense current accuracy.

FIG. 2 illustrates waveforms 200 of a typical low side current sensor and corresponding output stage of the switching converter in FIG. 1. PMOS high side device M1 is on when VLX is high and load current IL rises. NMOS low side device M2 is on when VLX is low and load current IL falls. Sense current ISENSE turns on when VLX goes low and falls from positive to negative in value. Positive current means current flows out of NMOS device M2 and negative current means current flow into NMOS device M2.

FIG. 3 shows a derivative current sensor employing a low pass RC filter, as a pre-filter to op-amp 305. PMOS high side device M4 and NMOS low side device M5, are driven by PMOS and NMOS drivers, respectively. Current sensor 300 includes on resistance RS, measured across the output of sense devices M4 and M5. On resistance RS of high side device M4 determines voltage VP, receives feedback current IFB set by current mirror devices M1, M2, and M3, and is an input to switch 310. On resistance RS of low side device M5 receives bias current IREF, which determines voltage VREF, and is an input to switch 315. Sense current ISENSE includes high side sense device current when input switch 310 is closed and switch 315 is open, and low side sense device current when input switch 310 is open and switch 315 is closed. Switches 310 and 315, when closed, configure on resistance RS to low pass filter resistance RLPF, and inverting input (V−) and non-inverting input (V+) and of op-amp 305, respectively. The output of op-amp 305 determines voltage VO and is the input to load resistance RO and load capacitance CC. Capacitance CLPF, along with resistance RLPF, comprise the low pass RC filter.

The current sensor of FIG. 3 generates VREF from a given IREF, and on resistance RS of the sense device, to determine a static operating point. In addition, a certain amount of current is generated by VREF and on resistance RS, even when the load current is not being generated. During this time, VP is maintained at exactly the same voltage as VREF, through negative feedback of the current mirror devices. This creates a certain offset current IOC, which combines with output sense current ISENSE. Because reference voltage VREF has some amount of error due to process variation, temperature, and supply voltage, offset current IOC further degrades the accuracy of output sense current ISENSE.

In addition, the current sensors shown in FIGS. 1 and 3 may detect only positive current because the current sensor does not sink sense current. A small amount of negative current may be detected by increasing the offset current, but this is a natural limitation for these types of current sensor topologies.

SUMMARY OF THE INVENTION

An object of this disclosure is to implement a Buck, Boost, or other switching converter with a versatile current sensor, by adding an integrator for instant sense current in the switching converter. The integrator calculates the average voltage of the switching converter and includes both positive and negative current sensing. The current sensor's response time is determined by the integrator coefficient and therefore not limited by the bandwidth of the current sensor.

Further, another object of this disclosure is to remove performance degradation in the current sensor due to the offset current.

Still further, another object of this disclosure is to provide a current sensor that does not need any kind of reference voltage or current.

To accomplish at least one of these objects, a Buck, Boost, or other switching converter is implemented, consisting of an output stage with both high and low side pass devices, and subtractor, integrator, and sample/hold circuits configured for current sensing. The low side pass device turns on, a switch between the subtractor and integrator is closed, and the integrator integrates the voltage between the sample/hold output and the subtractor input. The low side pass device turns off, a switch between the subtractor and integrator is opened, and the sample/hold circuit samples the integrator's output. After a few cycles of iteration, the sample/hold output is same as the integrator output and the current sensor output is the sample-to-sample averaged sense voltage.

In various embodiments, high accuracy current monitoring and current sensing may be achieved without an external sense device.

In other embodiments, the integrator of the current sensor may boost the gain of the Buck, Boost, or other switching converter.

DETAILED DESCRIPTION OF THE INVENTION

What is needed is for the current sensor to detect both positive and negative currents with improved accuracy, to maintain a stable switching environment for a Buck, Boost, or other type of switching converter.

Figure 4:
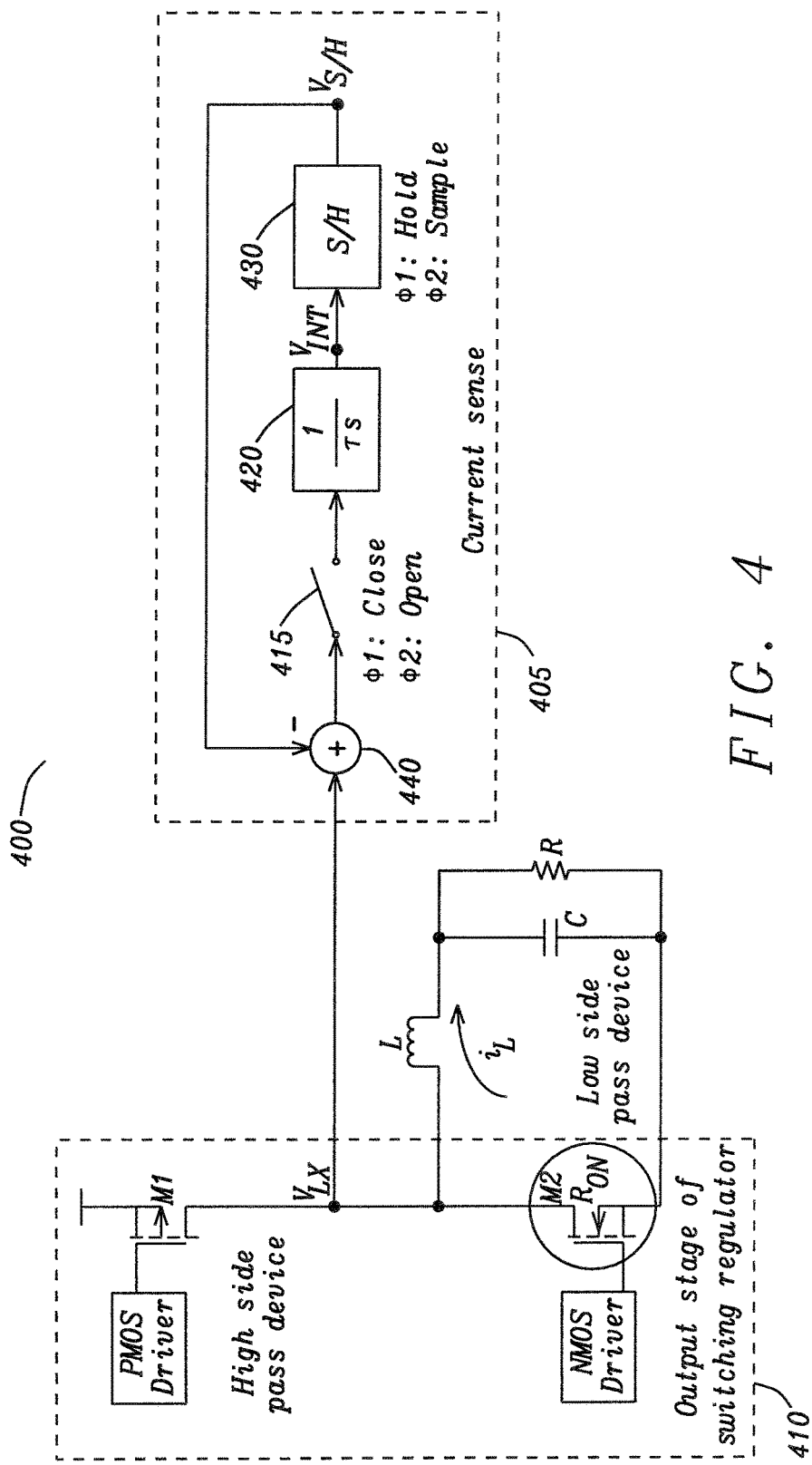
FIG. 4 is a circuit diagram illustrating the preferred implementation of a current sensor in a Buck, Boost, or other switching converter, embodying the principles of the disclosure.

FIG. 4 is circuit diagram 400 illustrating the preferred implementation of a current sensor in a Buck, Boost, or other switching converter, embodying the principles of the disclosure. Output stage 410 is comprised of PMOS high side device M1 and NMOS low side device M2, driven by PMOS and NMOS drivers respectively. The drains of devices M1 and M2 are connected at voltage VLX, and to inductor L, which is the input to load current IL into capacitance C and resistance R. Current sensor circuit 405 is comprised of subtractor 440, switch 415, integrator 420 and sample and hold circuit 430. Subtractor circuit 440 receives voltage VLX and sample and hold 430 output VSH, and passes their difference to switch 415. Switch 415 is closed for period φ1, when low side pass device M2 is turned on, and open for period φ2, when low side pass device M2 is turned off. Integrator circuit 420 acts to integrate the voltage difference between sample and hold output VSH and VLX. Integrator output VINT decreases, as switch 415 opens and closes for a given number of periods. Sample and hold circuit 430 samples the output of integrator 420, and its output VSH is integrator output VINT from the previous period.

Note that the current sensor of FIG. 4 requires no reference signal and detects both positive and negative sense currents. The voltage difference between VLX and GND is monitored to determine the sense current, and high accuracy current sensing is achieved without an external sense device.

Figure 1:
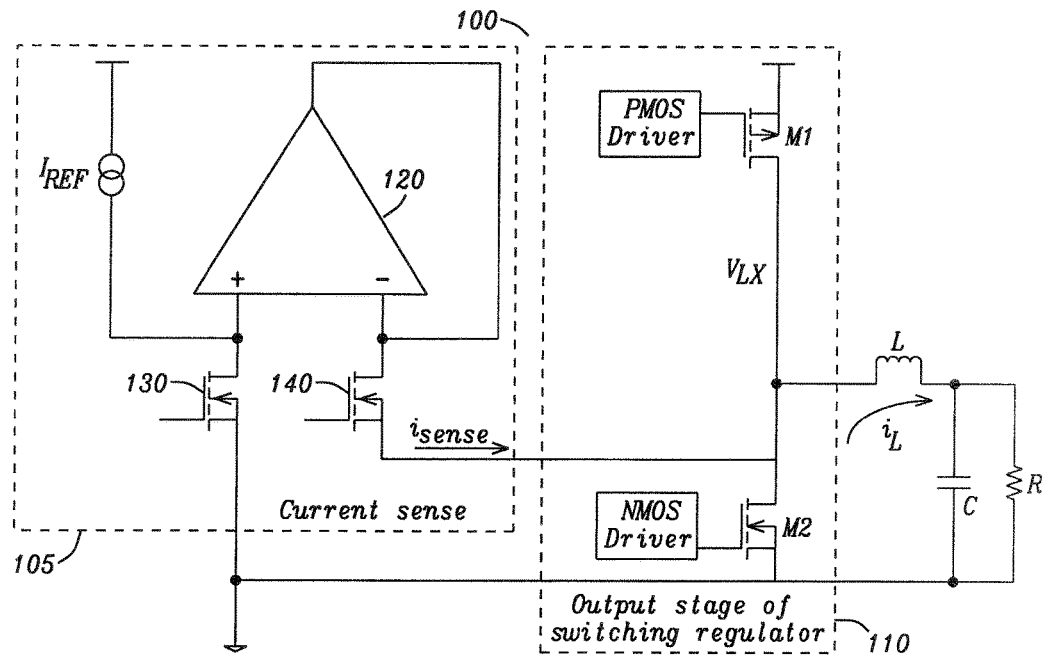
FIG. 1 shows a typical circuit topology of a low side current sensor and the corresponding output stage of a switching converter.
Figure 2:
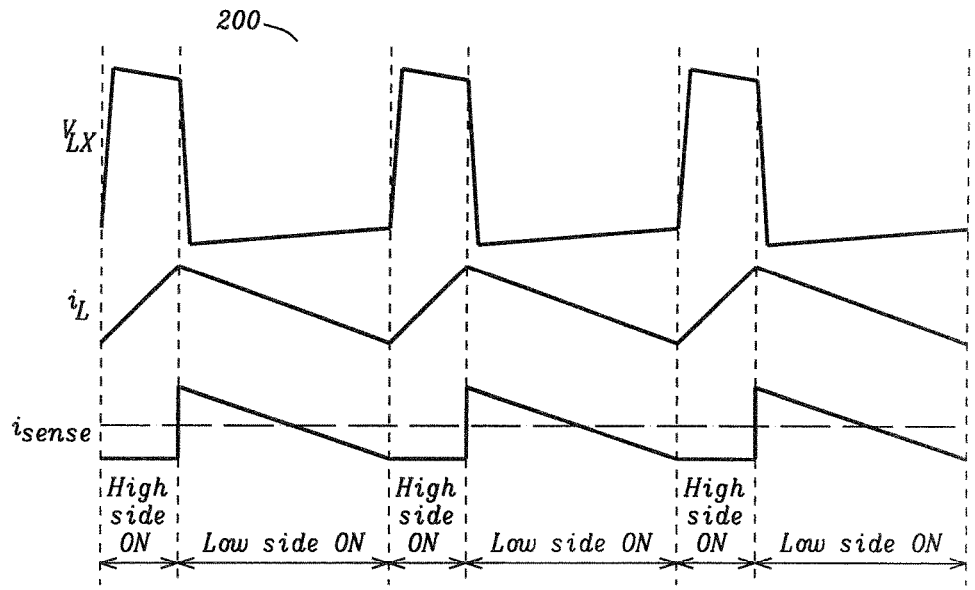
FIG. 2 illustrates the waveforms of a typical low side current sensor and corresponding output stage of a switching converter.
Figure 3:
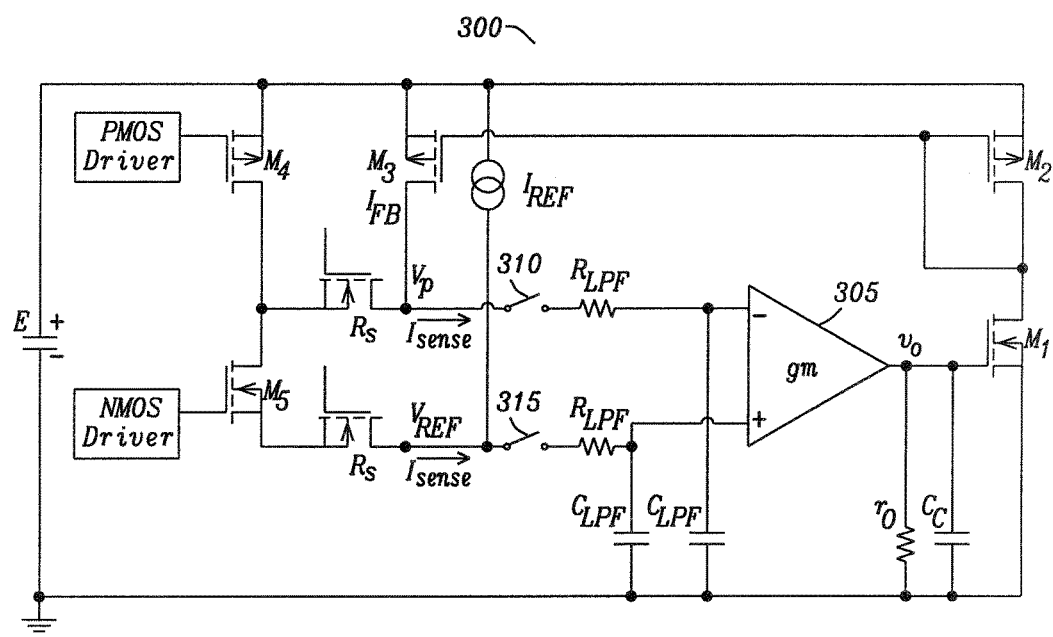
FIG. 3 shows a derivative current sensor employing a low pass filter.

Typical current sensors detect instant load current, then filter the load current to obtain the average sense current. For example, the op-amp used in FIG. 1 has limited frequency bandwidth, causing accuracy degradation in the sense current. The current sensor used in FIG. 4 resolves this intrinsic problem by employing an integrator, whose response time is determined by its integrator coefficient, and not limited by bandwidth.

Figure 5:
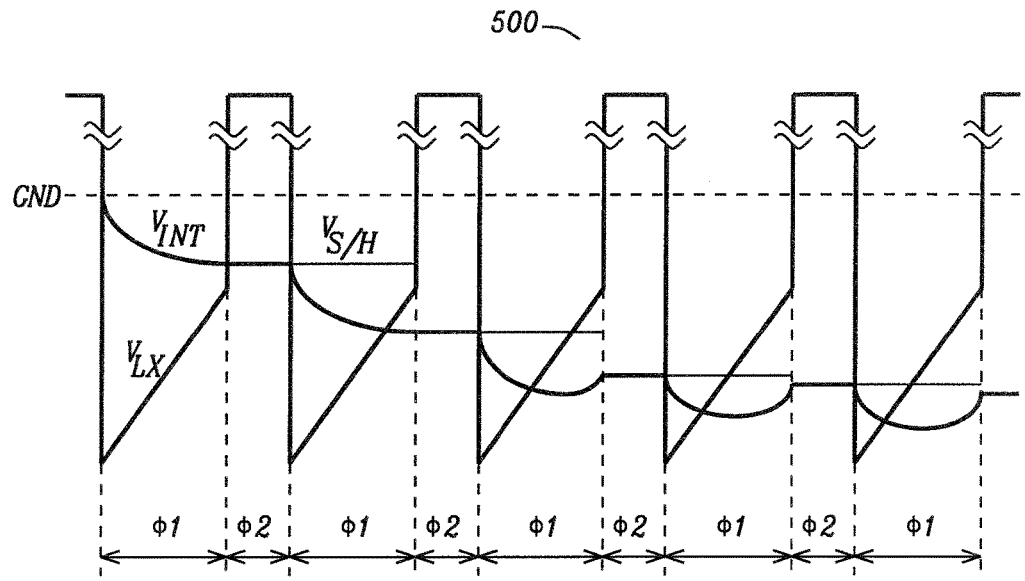
FIG. 5 illustrates the waveforms of a current sensor in a Buck, Boost, or other switching converter, embodying the principles of the disclosure.

Sample-to-sample time averaged sense current may be calculated from the instant current in current sense circuit 405 as $$i_{average} = \frac{1}{T_{\phi 1}} \int i_{(t)} dt.$$

where
$i_{average}$: Sample-to-sample time averaged sense current
$i_{(t)}$: Instant sense current
$T\phi 1$: Low side pass device M2 on time FIG. 5 illustrates waveforms 500 of a current sensor in a Buck, Boost, or other switching converter, embodying the principles of the disclosure. The waveforms assume a low side current sensor, and sample and hold output VSH at GND initially. Low side pass device M2 in FIG. 4 is turned on (φ1 start), and VLX is pulled down below GND, due to the inductive kick of L. During this time, switch 415, connected between subtractor 440 and integrator 420, is closed. Integrator 420 integrates the voltage difference between sample and hold output VSH and VLX, and integrator output VINT gradually decreases. Next, low side pass device M2 is turned off and switch 415 is open (φ1 end, φ2 start). Sample and hold 430 samples the output of integrator 420. After the end of this period, low side pass device M2 turns on again, and integrator 420 restarts integration. Sample and hold output VSH is integrator output VINT from the previous period, and the integrator level is smaller than previous period. After a few periods of iteration, sample and hold output VSH is exactly the same voltage as integrator output VINT. The current sensor output is the sample-to-sample time averaged value.

Figure 6:
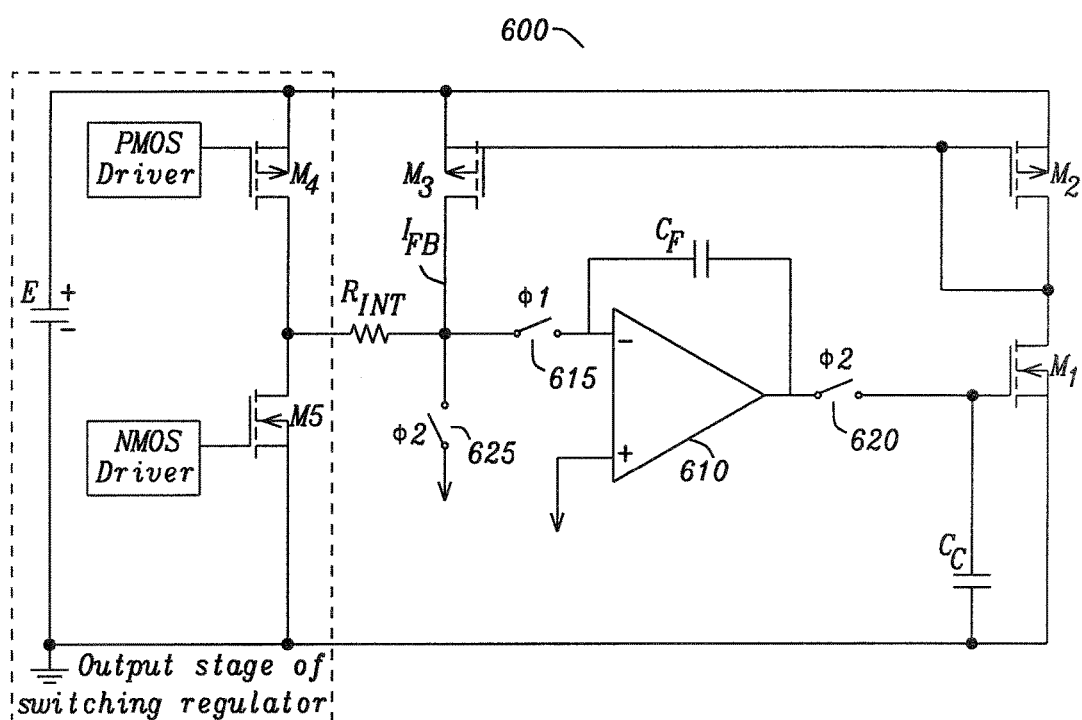
FIG. 6 shows a basic implementation example of a current sensor, working as a low side current sensor, embodying the principles of the disclosure.

FIG. 6 shows a basic implementation example, working as a low side current sensor 600, embodying the principles of the disclosure. Current feedback instead of voltage feedback is used in the sample and hold logic. PMOS high side device M4 and NMOS low side device M5, driven by PMOS and NMOS drivers, make up the output stage of a switching regulator. The drains of devices M4 and M5 are connected to integrator resistance RINT, and feedback current IFB is set by current mirror devices M1, M2, and M3. Resistance RINT and feedback current IFB connect to the input of switch 615, closed for period φ1, and switch 625, closed for period φ2. The current through resistance RINT includes low side sense device M5 when switch 615 is closed, configuring resistance RINT to inverting input (V−) of op-amp 610. The output of op-amp 610 is connected to switch 620, closed for period φ2, and along with capacitance CF, comprises the sample and hold logic. Load capacitance CC is connected to switch 620 and the source of NMOS device M1.

The current sensor of FIG. 6 may be used for a device with a one-sided power supply, such as a 3.3V operation. This implementation has some limitations including support of only a positive load current, and the fact that the temperature dependence of the on resistance of low side pass device M5 may not fully cancel. This implementation may be enough if the required specification is not too tight.

Figure 7:
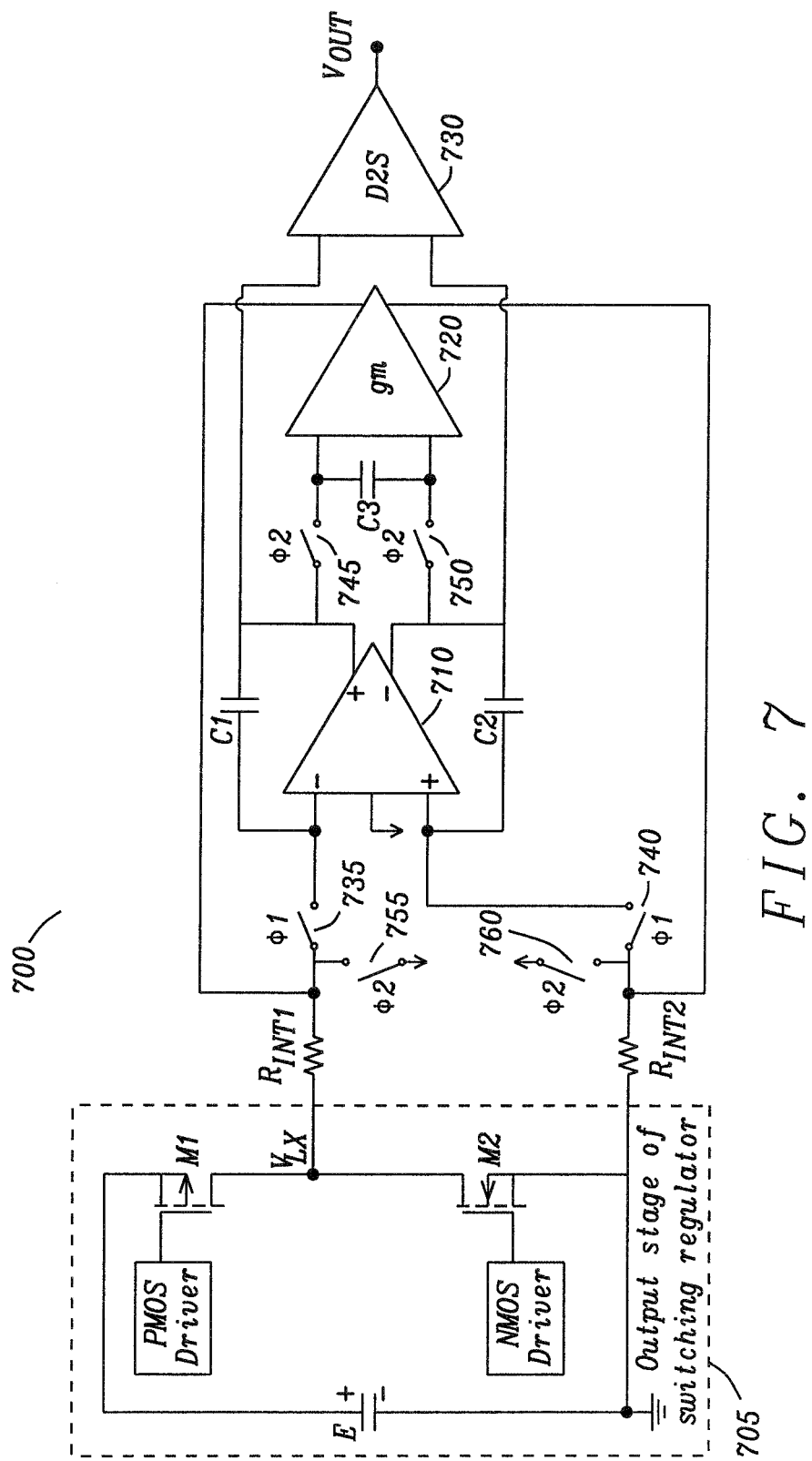
FIG. 7 illustrates a fully differential implementation example of a current sensor, supporting both positive and negative load currents, embodying the principles of the disclosure.

FIG. 7 illustrates a fully differential implementation example of a current sensor, supporting both positive and negative load currents, embodying the principles of the disclosure. Current sensor 700 is connected to output stage 705, which is comprised of PMOS high side device M1 and NMOS low side device M2, driven by PMOS and NMOS drivers, respectively. The drains of devices M1 and M2 are connected to a first integrator resistance RINT1, at voltage VLX. First integrator resistance RINT1 is connected to switch 735, closed for period ϕ1, and switch 755, closed for period ϕ2. The source of device M2 is connected to a second integrator resistance RINT2. Second integrator resistance RINT2 is connected to switch 740, closed for period ϕ1, and switch 760, closed for period ϕ2. Switches 735 and 740, when closed, configure first and second integrator on resistance RINT1 and RINT2, to inverting input (V−) and non-inverting input (V+) and of differential amplifier 710, respectively. The current through first integrator resistance RINT1 includes negative current from high side switch device M1 when switch 735 is closed, and second integrator resistance RINT2 includes positive current from low side switch device M2 when switch 740 is closed.

The output of differential amplifier 710 is controlled by two feedback paths, which, because of the amplifier's high gain, almost completely determine the output voltage for any given input. The positive output of differential amplifier 710 is connected to switch 745, closed for period ϕ2, and capacitance C1, connected to inverting input (V−) of differential amplifier 710. The negative output of differential amplifier 710 is connected to switch 750, closed for period ϕ2, and capacitance C2, connected to non-inverting input (V+) of differential amplifier 710. Load capacitance C3 is connected across the output of switches 745 and 750, and the input of transconductance 720. The first output of transconductance 720 is connected to first integrator resistance RINT1, switch 735 closed for period ϕ1, and switch 755 closed for period ϕ2. The second output of transconductance 720 is connected to second integrator resistance RINT2, switch 740 closed for period ϕ1, and switch 760 closed for period ϕ2. Differential to single end converter 730 has its inputs connected to capacitance C1 and capacitance C2, with output VOUT.

The fully differential implementation of current sensor 700 supports both positive and negative currents, and may be used to convert an analog signal into a form suitable for driving an analog to digital converter. The advantage of the fully differential implementation of FIG. 7 compared to the single ended implementation of FIG. 6 is its robustness to common noise, such as switching noise.

Figure 8:
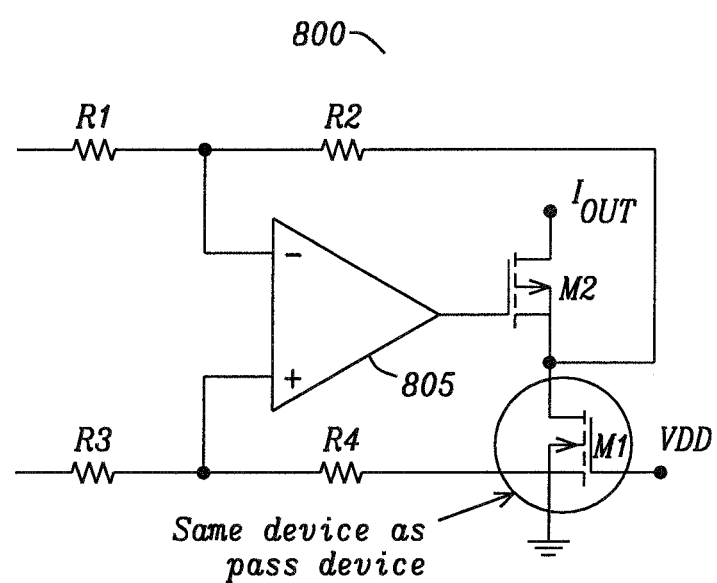
FIG. 8 shows a differential to single end converter with current output for a current sensor, embodying the principles of the disclosure.

FIG. 8 shows a differential to single end converter with current output for a current sensor, embodying the principles of the disclosure. Differential to single end converter (DS2) 800, found in FIG. 7, is comprised of op-amp 805, whose output is the input to the gate of NMOS sense device M2. The drain of NMOS sense device M2 is current IOUT and the gate of NMOS pass device M1 is voltage VDD. The source of sense device M2 is connected to the drain of pass device M1 and to resistance R2. Resistance R1 is connected to the inverting input (V−) of op-amp 805 and to resistance R2. Resistance R3 is connected to the non-inverting input (V+) of op-amp 805 and to resistance R4. Resistance R4 is connected to the source of pass device M1. Output current IOUT may compensate for the temperature dependence of the on resistance of sense device M2, with the implementation of pass device M1.

Figure 9:
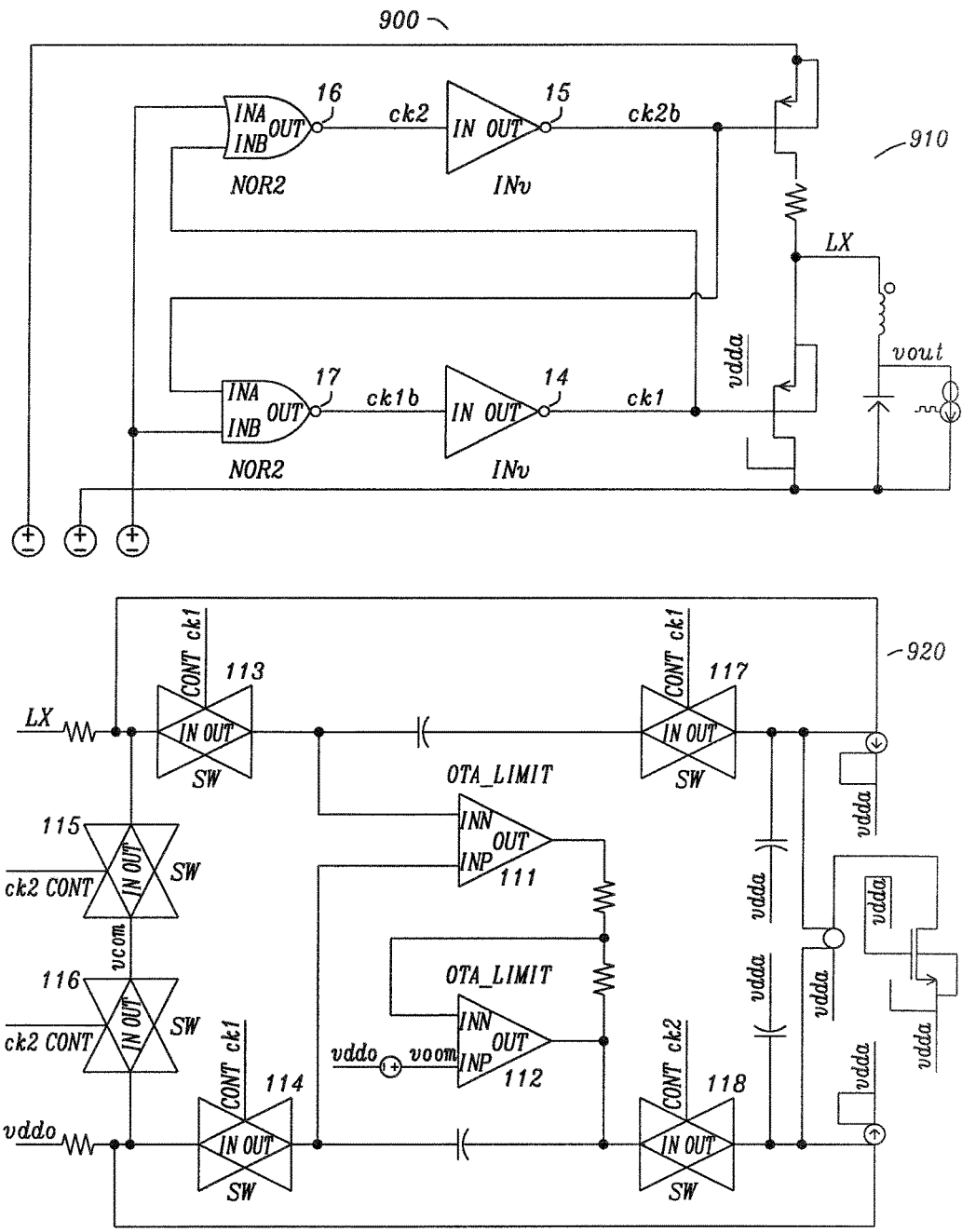
FIG. 9 illustrates a SPICE schematic for a current sensor in a Buck, Boost, or other switching converter, embodying the principles of the disclosure.

FIG. 9 illustrates SPICE schematics 900 for a current sensor in a Buck, Boost, or other switching converter, embodying the principles of the disclosure. SPICE schematic 910 shows a differential to single end converter with current output, for a current sensor, corresponding to the circuit diagram in FIG. 8. SPICE schematic 920 shows a fully differential implementation example of a current sensor, supporting both positive and negative load currents, corresponding to the circuit diagram in FIG. 7.

Figure 10:
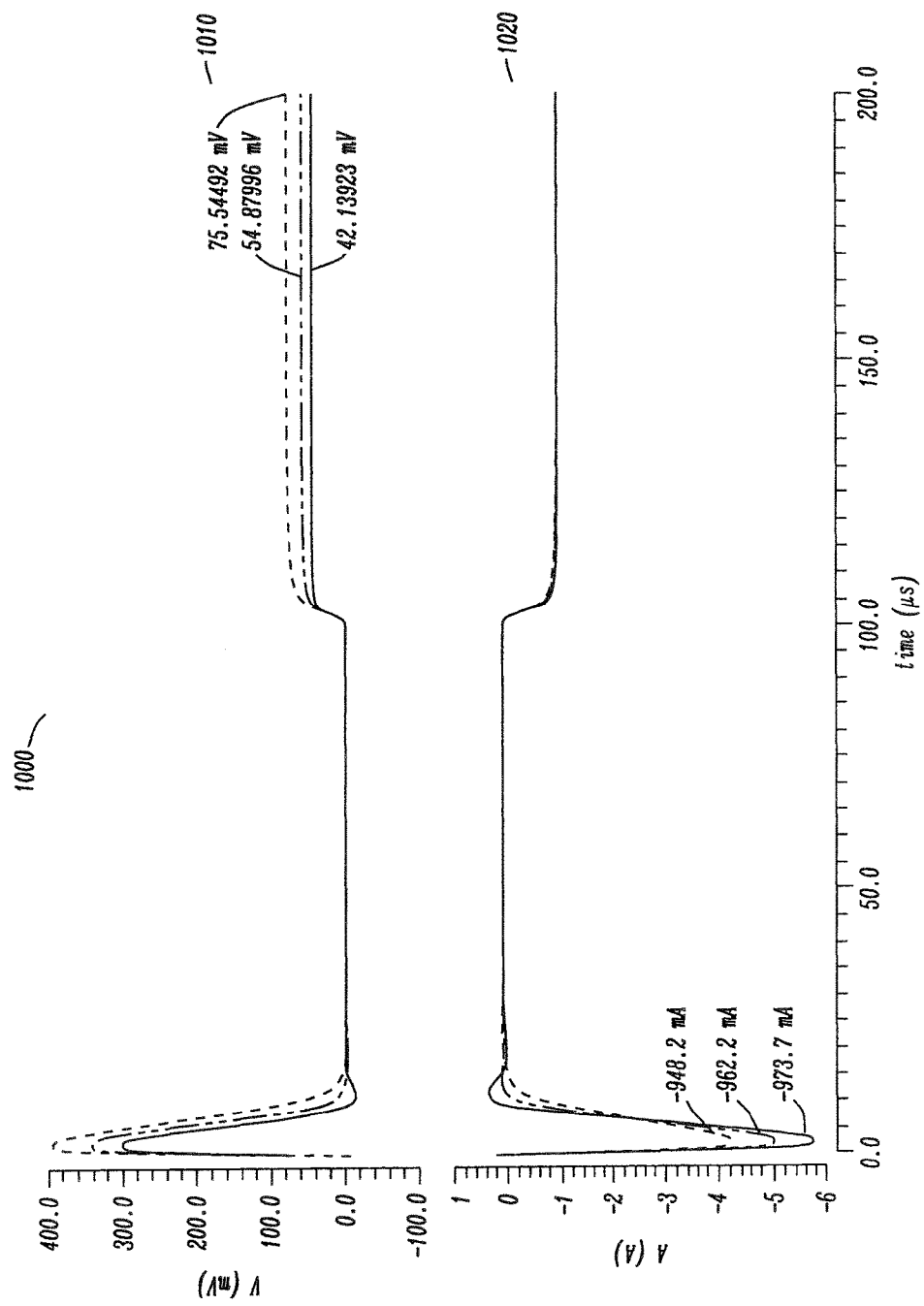
FIG. 10 shows SPICE simulation results for a current sensor in a Buck, Boost, or other switching converter, embodying the principles of the disclosure.

FIG. 10 shows SPICE simulation results 1000 for a current sensor in a Buck, Boost, or other switching converter, embodying the principles of the disclosure. SPICE simulation 1010 illustrates single ended output voltage VOUT, of differential to single end converter 730, in FIG. 7. The horizontal axis denotes time in microseconds and the vertical axis denotes voltage in millivolts. The load current of output stage 705 is zero until 100 us. At this time, the load current is changed to 1 A. The three lines of SPICE simulation in 1010 correspond to temperature settings of −40 C, 27 C, and 125 C, and illustrate output VOUT's dependence on temperature. A higher temperature produces a higher voltage, and the voltage varies from 42.1 mV to 75.5 mV, as the temperature increases from −40 C to 125 C.

SPICE simulation 1020 illustrates single ended output current IOUT, of differential to single end converter 805, in FIG. 8. The horizontal axis denotes time in microseconds and the vertical axis denotes current in amps. The load current of output stage 705 is zero until 100 us. At this time, the load current is changed to 1 A. The three lines of SPICE simulation in 1020 correspond to temperature settings of −40 C, 27 C, and 125 C, and illustrate output IOUT's relative independence of temperature. As the temperature varies from −40 C to 125 C, the current varies from −973.5 mA to −948.2 mA, a variation of less than 3%. Output current IOUT may compensate for the temperature dependence of the on resistance of sense device M2, with the implementation of pass device M1, in FIG. 8.

Figure 11:
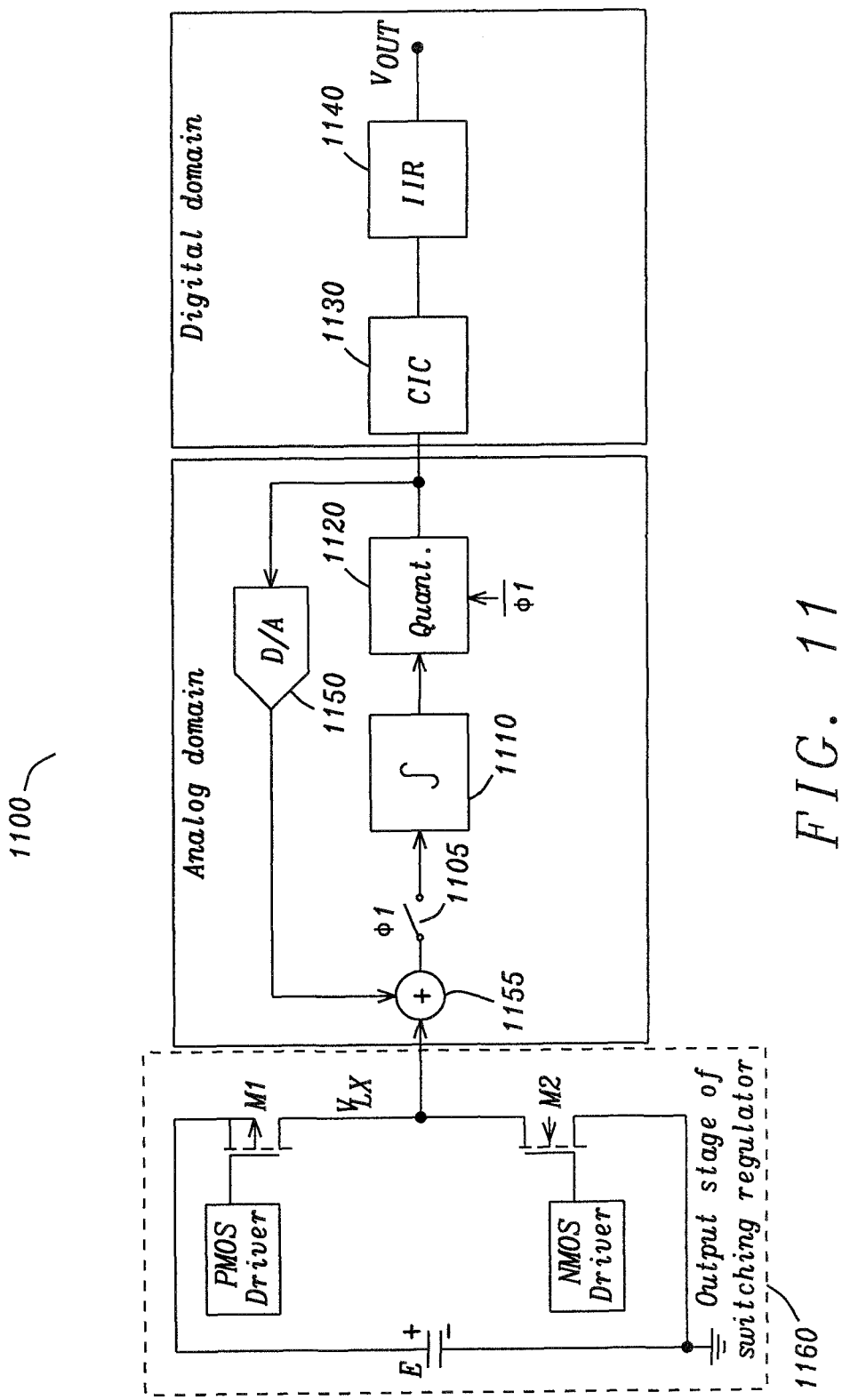
FIG. 11 illustrates a block diagram of a current sensor circuit with Delta Sigma Modulator (DSM) type analog-to-digital converter (ADC).

FIG. 11 illustrates a block diagram of current sensor circuit 1100 with Delta Sigma Modulator (DSM) type analog-to-digital converter (ADC). Output stage 1160 is comprised of PMOS high side device M1 and NMOS low side device M2, driven by PMOS and NMOS drivers respectively. The drains of devices M1 and M2 are connected at voltage VLX, to subtractor 1155, which is the input to switch 1105 and closed for period ϕ1. Switch 1105 is connected to integrator 1110, which is the input to quantizer circuit 1120. Quantizer circuit 1120 replaces each voltage value with a discrete value for digital signal processing, when switch 1105 is open. Subtractor circuit 1155 receives voltage VLX and digital-to-analog converter 1150 output, and passes their difference to switch 1105. Switch 1105 is closed for period ϕ1, when low side pass device M2 is turned on, and open for period ϕ2, when low side pass device M2 is turned off. Integrator circuit 1110 acts to integrate the voltage difference between digital-to-analog converter 1150 and VLX. Integrator output 1110 decreases, as switch 1105 opens and closes for a given number of periods. Quantizer circuit 1120 samples the output of integrator 1110, and its output is the integrator output, quantized, from the previous period.

The delta sigma modulator (DSM) is comprised of cascaded integrator-comb (CIC) filter 1130 and infinite impulse response filter (IIR) 1140. The DSM and analog-to-digital converter (ADC) work to encode the analog signal of quantizer circuit 1120, using high-frequency delta-sigma modulation. Then a digital filter is applied to form a higher-resolution but lower sample-frequency digital output VOUT. The analog signal is mapped to a voltage in CIC 1130 and then smoothed with IIR 1140, which simplifies circuit design and improves efficiency.

Figure 12:
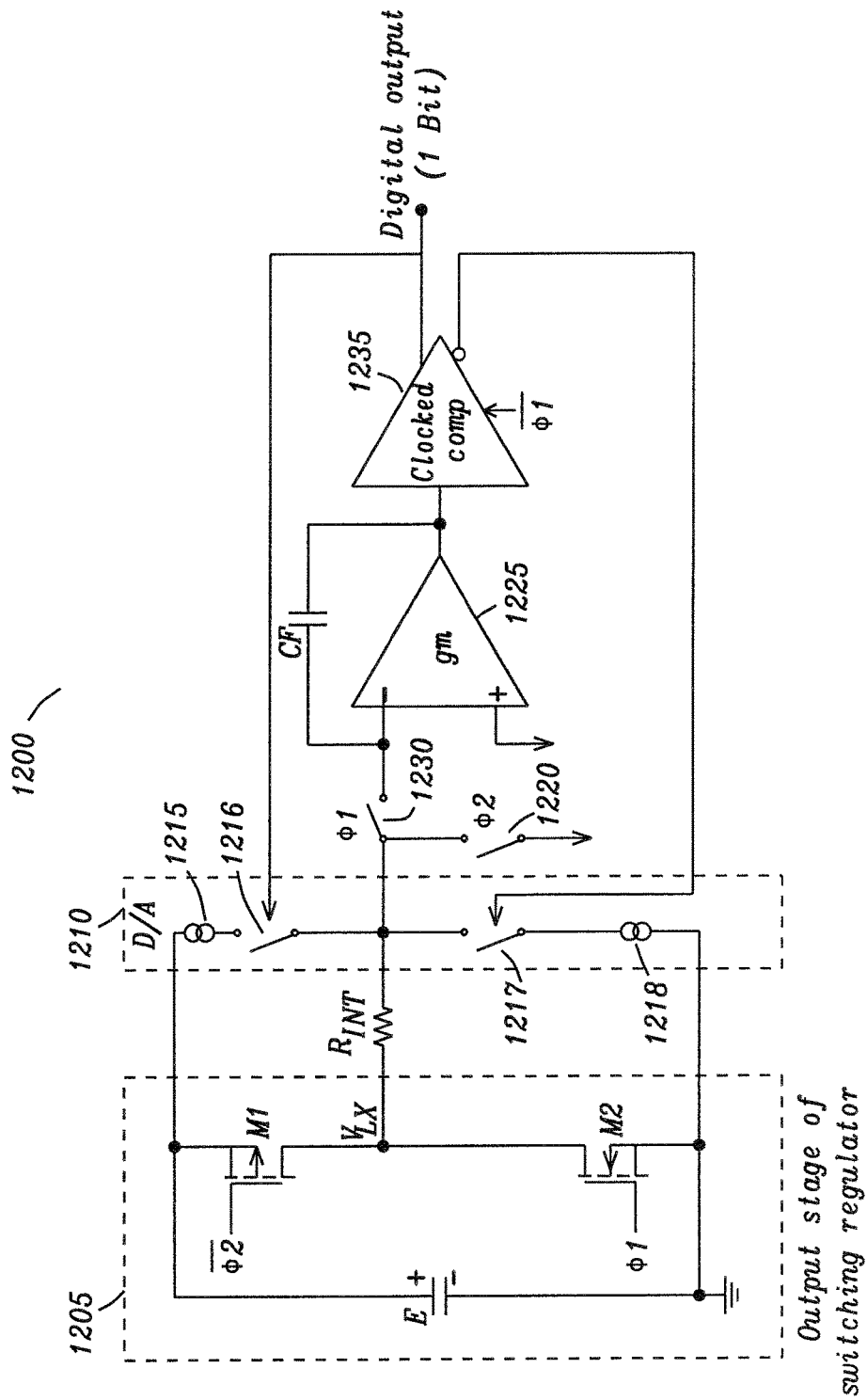
FIG. 12 is a circuit diagram showing a single ended implementation of a current sensor with first order DSM type ADC.

FIG. 12 is a circuit diagram showing a single ended implementation of a current sensor with first order DSM type ADC. Current sensor 1200 is comprised of output stage 1205, which is further comprised of PMOS high side device M1 and NMOS low side device M2. The drains of devices M1 and M2 are connected to integrator resistance RINT. Digital-to-analog converter 1210 is comprised of a first feedback current, set by bias current 1215 when switch 1216 is closed, and a second feedback current, set by bias current 1218 when switch 1217 is closed. Resistance RINT and the first and second feedback currents drive switch 1230, closed for period φ1, and switch 1220, closed for period φ2. The current through resistance RINT includes low side switch M2, when switch 1230 is closed, configuring resistance RINT to inverting input (V−) of op-amp 1225. The output of op-amp 1225 is connected to capacitance CF and clocked comparator 1235, during period φ2, for digitizing the output. The analog-to-digital function is achieved when clocked comparator 1235 measures the analog current output of op-amp 1225 and digitizes the output into one binary digital signal.

The implementation in FIG. 12 consists of integrator 1225, quantizer (comparator) 1235 and current steering DAC 1210 for the feedback signal. This implementation is straightforward and requires no temperature compensation. Temperature compensation for the sense gain is implemented in the reference current generator block 1210, to achieve current steering in the digital-to-analog converter.

Figure 13:
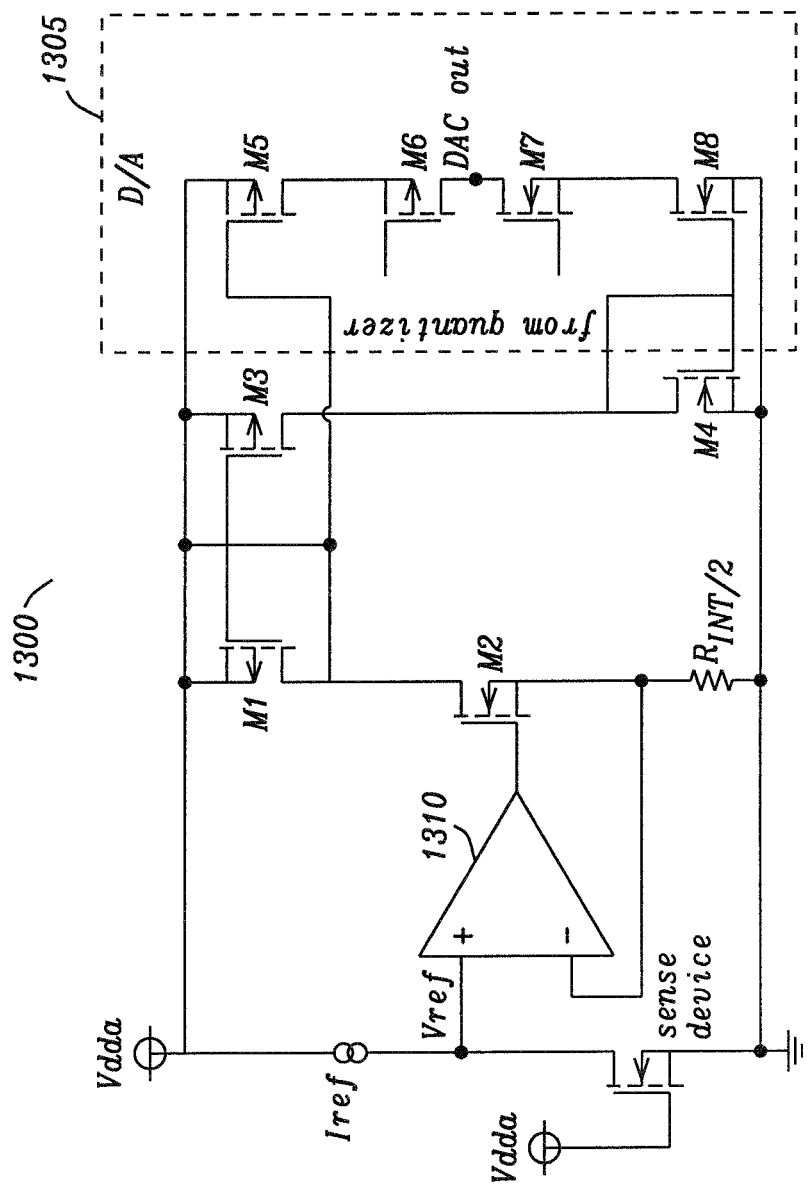
FIG. 13 shows a reference current generator block for current steering in a digital-to-analog converter (DAC).

FIG. 13 shows a reference current generator block for current steering in the digital-to-analog converter (DAC) of FIG. 12. Current steering 1300 is comprised of constant bias current IREF, reference current generator block and sense device that emulates the characteristics of the pass device, and digital-to-analog converter 1305. Reference current generator block is comprised of op-amp 1310, current mirror devices M1, M2, M3, and M4, voltage VREF and resistance RINT/2. Voltage VREF is generated by both REF and the on resistance of the sense device, and is connected to the non-inverting input (V+) of op-amp 1310. Resistance RINT/2 is connected across the inverting input (V−) of op-amp 1310 and ground.

The output of op-amp 1310 is the input to the source and gate of M2, as well as resistance RINT/2. Digital-to-analog converter 1305 is comprised of devices M5, M6, M7, and M8. The sources of devices M6 and M7 are connected to the quantizer 1235 output, and the drains represent the output of the DAC itself. Device M5 has its source and gate connected to voltage VDDA, and its drain to the source and gate of device M6. Device M8 has source and gate connected to ground, and its drain to the source and gate of device M7.

The DAC feedback current is generated based on VREF and RINT/2. This current compensates for the sense gain of the current sense device, and is dependent of the on resistance of the sense device. The sense gain of the current sense circuit is then compensated for by the DAC feedback current.

Figure 14:
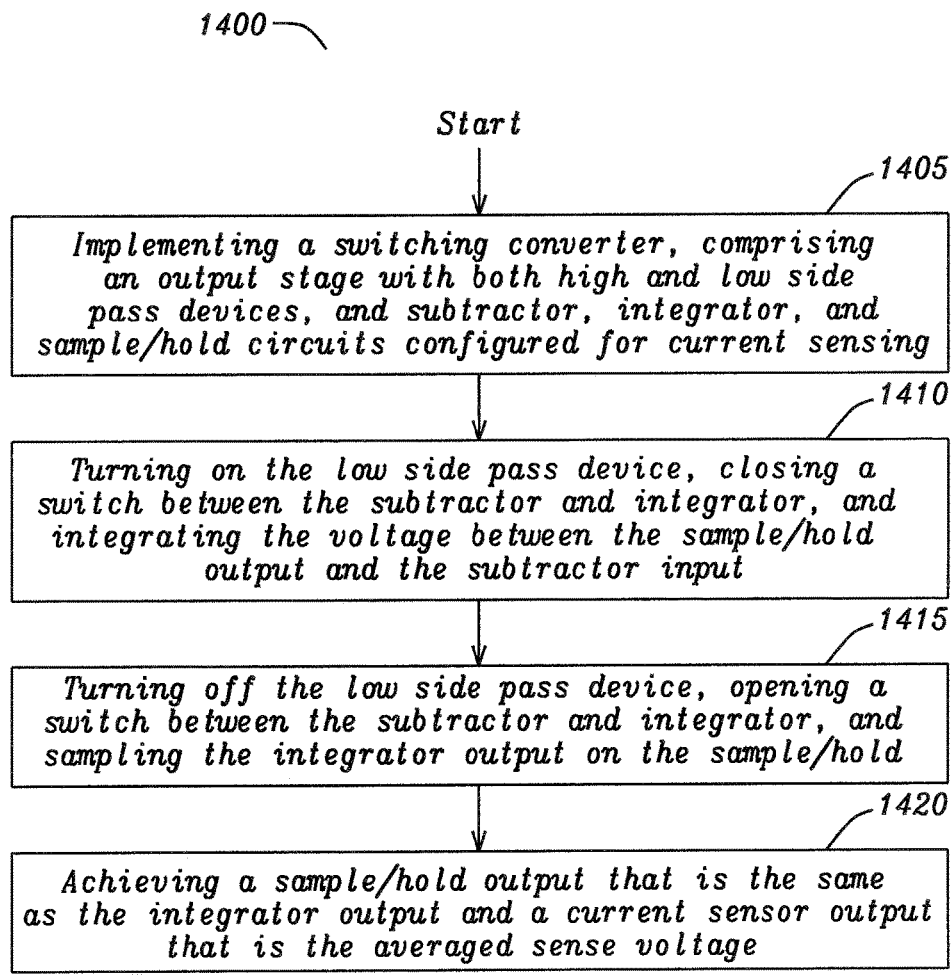
FIG. 14 illustrates a flowchart of a method for implementing a current sensor and output stage of a switching converter.

FIG. 14 illustrates a flowchart of a method for implementing a current sensor and output stage of a switching converter. Step 1405 shows implementing a switching converter, comprising an output stage of both high and low side pass devices, and subtractor, integrator, and sample/hold circuits, configured for current sensing. Step 1410 illustrates turning on the low side pass device, closing a switch between the subtractor and integrator, and integrating the voltage between the sample/hold output and the subtractor input. Step 1415 shows turning off the low side pass device, opening a switch between the subtractor and integrator, and sampling the integrator output on the sample/hold. Step 1420 illustrates achieving a sample/hold output that is the same as the integrator output and a current sensor output that is the averaged sense voltage.

The advantages of one or more embodiments of the present disclosure include improved current sampling, allowing for true averaging of positive and negative currents by the current sensor, employing a simple configuration and no limitations. The current sensor requires no voltage or current reference, and its structure minimizes error and other variables, generating both analog and digital outputs.

While this invention has been particularly shown and described with reference to the preferred embodiments thereof, it will be understood by those skilled in the art that various changes in form and details may be made without departing from the spirit and scope of the invention.

The invention claimed is:

1. A switching converter, comprising:
    an output stage with both high and low side pass devices;
    a current sensor comprising:
        a subtractor configured to receive output voltages of a sample and hold circuit, and of the drains of said high and low side pass devices, and pass their difference to a switch;
        a switch configured to be closed for a period, when said low side pass device is turned on, and open for a period, when said low side pass device is turned off;
        an integrator configured to integrate the voltage difference between said sample and hold output and the voltage at the drains of said high and low side pass devices;
        said sample and hold circuit configured to sample the output of said integrator from the previous period; and
        wherein an output of the current sensor is an averaged sense voltage.

2. The switching converter of claim 1, wherein said integrator is configured to provide instant sense current in said switching converter.

3. The switching converter of claim 1, wherein said integrator is configured such that the output of said integrator decreases as said switch opens and closes for a given number of periods.

4. The switching converter of claim 1, wherein said sample and hold circuit is configured such that the output of said sample and hold circuit is said integrator output from the previous period.

5. The switching converter of claim 1, wherein said current sensor is configured to include both positive and negative current sensing.

6. The switching converter of claim 1, wherein said current sensor is configured such that the response time of said current sensor is determined by the integrator coefficient of said integrator.

7. The switching converter of claim 1, wherein said current sensor is configured to remove performance degradation due to the offset current.

8. The switching converter of claim 1, wherein said current sensor is configured with no reference voltage or no reference current.

9. The switching converter of claim 1, wherein said current sensor is configured for high accuracy current monitoring and current sensing without an external sense device.

10. The switching converter of claim 1, wherein said integrator of said current sensor is configured to boost the gain of said switching converter.

11. A method for implementing a switching converter, comprising the steps of:
   implementing a current sensor and output stage, comprising high and low side pass devices, and subtractor, integrator, and sample and hold circuits, configured for current sensing;
   turning on the low side pass device, closing a switch between the subtractor and integrator, and integrating the voltage between the sample and hold output and the subtractor input;
   turning off the low side pass device, opening a switch between the subtractor and integrator, and sampling the integrator output on the sample and hold; and
   achieving a sample/hold output that is the same as the integrator output and a current sensor output that is the averaged sense voltage.

12. The method for implementing a switching converter of claim 11, wherein said integrator provides instant sense current in said switching converter.

13. The method for implementing a switching converter of claim 11, wherein said current sensor includes both positive and negative current sensing.

14. The method for implementing a switching converter of claim 11, wherein said current sensor removes performance degradation due to the offset current.

15. The method for implementing a switching converter of claim 11, wherein said integrator of said current sensor boosts the gain of said switching converter.

16. The method for implementing a switching converter of claim 11, wherein a low side current sensor employs current feedback, instead of voltage feedback, in said sample and hold logic.

17. The method for implementing a switching converter of claim 11, wherein a fully differential current sensor supports both positive and negative load currents.

18. The method for implementing a switching converter of claim 11, wherein a differential to single end converter comprises said current sensor, with current output.

19. The method for implementing a switching converter of claim 11, wherein a current sensor circuit employs a Delta Sigma Modulator (DSM) type analog-to-digital converter (ADC).

20. The method for implementing a switching converter of claim 11, wherein a digital-to-analog converter (DAC) uses a reference current generator block for current steering.

* * * * *